United States Patent
Greenwood et al.

(10) Patent No.: US 6,598,200 B1
(45) Date of Patent: Jul. 22, 2003

(54) METHOD AND APPARATUS FOR FREQUENCY DOMAIN DATA FRAME TRANSMISSION

(75) Inventors: John Christopher Greenwood, Near Chippenham (GB); David Carotti, Brockenhurst (GB)

(73) Assignee: Nortel Networks Limited, St. Laurent (CA)

( * ) Notice: Subject to any disclaimer, the term of this patent is extended or adjusted under 35 U.S.C. 154(b) by 321 days.

(21) Appl. No.: 09/587,036

(22) Filed: Jun. 2, 2000

(51) Int. Cl.$^7$ ............................................. H03M 13/00
(52) U.S. Cl. ........................................ 714/774; 714/776
(58) Field of Search ................................. 714/776, 774; 370/329, 341

(56) References Cited

U.S. PATENT DOCUMENTS

| | | | | |
|---|---|---|---|---|
| 4,858,232 A | * | 8/1989 | Diaz et al. ................... | 370/465 |
| 4,987,570 A | * | 1/1991 | Almond et al. .............. | 370/540 |
| 5,117,423 A | * | 5/1992 | Shepherd et al. ........... | 370/280 |
| 5,191,576 A | * | 3/1993 | Pommier et al. ............ | 370/312 |
| 5,315,584 A | * | 5/1994 | Savary et al. ................ | 370/312 |
| 5,604,744 A | * | 2/1997 | Andersson et al. .......... | 370/347 |
| 5,673,259 A | * | 9/1997 | Quick, Jr. ..................... | 370/342 |
| 5,717,725 A | * | 2/1998 | Campana, Jr. ............... | 375/347 |
| 5,768,276 A | * | 6/1998 | Diachina et al. ............ | 370/432 |
| 5,850,602 A | * | 12/1998 | Tisdale et al. ............... | 455/430 |
| 6,028,860 A | * | 2/2000 | Laubach et al. ........ | 370/395.64 |
| 6,061,820 A | * | 5/2000 | Nakakita et al. ............ | 714/751 |
| 6,185,265 B1 | * | 2/2001 | Campanella ................ | 375/341 |

* cited by examiner

Primary Examiner—Albert Decady
Assistant Examiner—Joseph D. Torres
(74) Attorney, Agent, or Firm—Barnes & Thornburg

(57) ABSTRACT

Within a transmission channel in a frequency domain transmission medium, a plurality of non-contiguous channel portions are selected for data transmission. The selected channel portions are separated in frequency by unused channel portions. A transmitter generates a data frame of predetermined length for transmission, comprising a payload and an error detection portion. The frame length is equal to the length which would map for transmission into a symbol in the transmission channel if the entire channel were selected for transmission. The payload contains a header and a data portion, into which the transmitter inserts data bytes and a number of padding bytes. Block coding error correction is performed on the padded payload to generate error detection bytes to fill the error detection portion. The frame is then mapped into the frequency domain for transmission such that the header, data and error detection bytes map into the selected channel portions and the padding bytes map into the unused channel portions and are not transmitted. At a receiver, the padding bytes are reinstated and error detection performed to correct transmission errors in the header and the data. The corrected data is then extracted from the frame.

15 Claims, 5 Drawing Sheets

METHOD AND APPARATUS FOR FREQUENCY DOMAIN DATA FRAME TRANSMISSION

TECHNICAL FIELD

This invention relates to a method and apparatus for transmitting data frames in frequency domain data transmission systems, and particularly for implementing forward error correction in orthogonal frequency division multiplexed (OFDM) data transmission systems.

BACKGROUND OF THE INVENTION

It is known to transport telecommunications signals over a medium in a plurality of separate frequency channels at the same time. This can be achieved using a frequency domain modulation scheme such as OFDM or coded orthogonal frequency division multiplexing (COFDM) and is desirable in transmission media which carry other signals in predetermined frequency bands or suffer from noise in particular frequency bands. Examples of such media are the use of powerlines (PL) for transporting telecommunications data to and from subscribers, cable television (CATV) systems and fixed wireless access (FWA) systems.

Use of OFDM for signal transmission in PL media is known from U.S. Ser. No. 09/419,209, which is incorporated herein by reference. U.S. Ser. No. 09/419,209 also describes the use of OFDM for signal transmission in more than one frequency band, as follows.

One of the problems with using power lines as a communications medium is that they are subject to noise and interference, for example due to cables picking up radio signals such as broadcast AM radio signals and amateur radio band transmissions, or electrical noise from electrical equipment coupled to the power lines. Noise propagates along the power lines and can corrupt communications signals.

CATV and FWA suffer similar problems, though not necessarily from the same sources. For example, in CATV noise can result from ingress at the consumer connection and inter-modulation products from the TV carriers.

FIG. 1 shows typical background noise on an underground power line across the frequency band 0–10 MHz. It is known to be advantageous to transmit communications signals within the frequency bands 2.2–3.5 MHz (PLT1) and 4.2–5.8 Mz (PLT2) because these bands fall between the medium wave and short wave bands used for broadcast radio transmissions and avoid the radio amateur band at 3.5–3.8 MHz. There is a reduced level of background noise in these bands and the radiation of power line communications signals in this frequency band causes minimum interference with radio receiver equipment at subscriber premises. Other frequency bands in the range of, for example, 2–30 MHz can be used although it is preferred to use the lower frequencies because attenuation over the distribution cables is lower.

Upstream and downstream transmissions preferably share a common frequency band with the upstream and downstream transmissions occupying different times.

The use of OFDM provides flexibility to fit into non-uniform and non-contiguous frequency allocations, while maintaining reasonable spectral efficiency. This results from the intrinsic nature of OFDM which is composed of a large number of simultaneously transmitted sub-carriers which are staggered in frequency each individually occupying a low bandwidth, as illustrated in FIG. 2. The scheme's flexibility comes about from the ability of designate which sub-carriers are to be activated and which are not. Regarding spectral efficiency, the signal composition results in an intrinsic spectrum fall-off outside of the active bandwidth commensurate with the bandwidth of each sub-carrier rather than with the total spectrum width. Thus relatively low excess bandwidths can be achieved.

Therefore, the spectral attributes of OFDM represent a major advantage in favor of its selection for use in power line telecommunication systems.

A further difficulty of transmission over certain media in more than one frequency band is frequency selective fading, particularly if the frequency bands are non-contiguous. An OFDM transmission system is again suited to such systems because of the possibility for adaptively selecting which portions of the frequency spectrum are to be used, enabling the avoidance not only of mutual interference but also of areas of poor transmission capability in the frequency spectrum which may arise from time to time due to frequency selective fading.

A problem then arises as to how to encode framed data for transmission over a variable bandwidth in an OFDM system requiring use of a constant OFDM symbol length because, as the available bandwidth varies, so does the total capacity of each symbol. A further problem then arises as to how to apply effective error detection or correction to frames of variable capacity.

SUMMARY OF THE INVENTION

An object of the invention is to provide an efficient method and apparatus for handling data for transmission over a variable bandwidth transmission channel or a transmission channel in which transmissions are carried in two or more non-contiguous channel portions.

A further object of the invention is to provide effective error correction for a transmission over a variable bandwidth transmission channel or a transmission channel in which transmissions are carried in two or more non-contiguous channel portions.

The invention provides a method and an apparatus for transmitting a data frame between a transmitter and a receiver in a frequency domain data transmission system using a transmission channel from which one or more channel portions are selected, by adaptive or preemptive selection or by allocation, for data transmission such that the channel contains one or more unused channel portions, comprising the steps of;

inserting data bits into a payload portion of the data frame;

padding with a predetermined bit sequence a portion of the payload;

applying error correction to the data bits and the padding bits and inserting error detection bits into an error detection portion of the frame to form a data frame of a predetermined length;

mapping the data frame into the transmission channel such that the payload and the error detection bits are mapped to and transmitted in the one or more selected channel portions and the padding bits are mapped to the one or more unused channel portions and are not transmitted;

receiving the data bits and the error detection bits from the one or more selected channel portions;

reinserting the padding bit sequence to restore the predetermined-length frame, subject to any transmission errors;

applying error correction using the error detection bits to correct the transmission errors in the data bits, where possible; and extracting the data bits.

In further aspects the invention provides a transmission method and a reception method for carrying out the method above, and a transmitter and a receiver for implementing these methods, as defined in the appended claims.

In a further aspect, the invention provides a reduced-length data frame, comprising the payload and the error detection bits as transmitted and received by the method and apparatus of the invention.

Advantageously, the data padding may comprise zero padding, in the form of a sequence of zero bits.

The invention may operate advantageously with any block coding error correction scheme, such as Reed-Solomon coding.

In a transmission system embodying the invention, after the step of applying error correction and before transmission, a padded data frame may undergo conventional techniques such as interleaving, inner coding and energy dispersal. Such techniques may rearrange the bits within a frame but are predictable, so that they can be taken into account in the step of mapping the payload and the error-detection bits to the adaptively-selected channel portion or portions.

The transmission channel into which the invention maps a data frame is a contiguous frequency band. Within that band, one or more channel portions are adaptively selected to carry the payload and error detection portion of the data frame; padding bits within the payload map into any unused channel portions(s). In various aspect the invention may therefore find a variety of applications. For example, if two or more non-contiguous channel portions, or sub-channels, are available for data transmission (as in the PL application described above), those non-contiguous channel portions may be considered as being within a larger, contiguous channel and each frame padded such that the payload and error detection bits map into the non-contiguous channel portions and the padding bits map into the unused frequency bands between them.

In a further aspect of the invention, the transmission channel may be sounded, or monitored, during use and the channel portion or portions for future transmission adaptively selected in real time in response to channel conditions. Thus, for example, if a channel portion generates a high transmission error rate it may be selected not to be used. A portion of the payload of corresponding size in future frames may then be padded and mapped into this unused channel portion.

These aspects of the invention may also be combined, so that a system initially set up using two or more non-contiguous channel portions may sound, or monitor, each channel portion and stop using one or more of them if channel conditions in that channel portion deteriorate over time. This embodiment of the invention may find particular application in a PL system, for example, where non-contiguous channel portions are used in a noisy environment.

In summary, a preferred embodiment of the invention may incorporate the following features. In an adaptive or pre-emptive transmission system, both the transmitter and the receiver of a data frame may advantageously know in advance which parts of the frequency spectrum will be used for transmitting a frame, and thus the total available bandwidth. With this knowledge when the frame is assembled for transmission, padding may be inserted into a portion of the frame corresponding in size to the capacity of a frequency band or bands (channel portion or portions) within the transmission channel which are not to be used for transmission due to frequency selective fading. FEC (forward error correction) block coding can then be applied to the payload of the padded frame, and the frame mapped into the frequency domain for transmission such that the payload and the error detection bits map into the adaptively or preemptively selected channel portion or portions, and the padding bits map into the unused channel portion or portions (which have not been selected for transmission). It should be noted that in this way the frame, which is of predetermined length, maps into the whole of the transmission channel. A constant symbol length is therefore retained despite the adaptively-selected bandwidth being less than the contiguous channel bandwidth, while the padding bits are not actually transmitted. The receiver may then impose the same padding on the received frame before FEC decoding. This may advantageously automatically increase the coding power, or error correction capability, of the FEC coding system if the total available bandwidth reduces due, for example, to frequency selective fading. This effect is preferably achieved while retaining a chosen predetermined FEC coding overhead, which ensures efficient FEC block coding.

Therefore, according to a preferred embodiment of the invention, as the adaptive frequency allocation process reduces frequency (bandwidth) allocation, the number of data bits in each data frame, or symbol, is reduced, but the chosen FEC coding overhead remains the same so that the effective error correction capability of the FEC coding increases.

The invention may therefore advantageously allow improved flexibility in the adaptive frequency allocation process and also provide an adaptive coding power, or error detection; capability, which tracks channel conditions by providing increased coding power as channel conditions deteriorate or as channel bandwidth is otherwise reduced.

In an alternative preferred embodiment, the relative numbers of data bits and error detection bits in a frame may be adaptively varied in response to the available bandwidth of the adaptively-selected channel portion(s) in order, for example, to maintain the same error correction capability under all channel conditions. This advantageously maximises the data transmission rate under all channel conditions without reducing error correction capability.

It can be seen that the invention addresses a problem arising from the variation in data load in each symbol in an OFDM system in which transmission bandwidth is variable. Block coding, such as Reed Solomon coding, has been found to be optimum for forward error correction (FEC) in many instances, such as in PL systems, and variable data load per OFDM or COFDM symbol places constraints on such block codes. These constraints are alleviated by the invention.

To illustrate this advantage of the invention, an alternative method of implementing block coding in conditions requiring a variable data load in each symbol, to match the variable bandwidth of the channel, might be to divide the data stream into small fixed-length sequences and to constrain the adaptive process to the size of these sequences. In such a scheme, if the channel bandwidth changes due to fading of a channel portion, or sub-channel, the bandwidth reduction would be accommodated by transmitting fewer fixed-length sequences rather than by transmitting symbols (larger than the sequences) with variable data load. In such a scheme, block coding could be applied to each small fixed-length sequence in conventional manner. However, this approach has a number of disadvantages. First, small code block lengths lead to high overheads, both in decoder processing and data overhead. Second, the error correction capability is fixed for a given code overhead per block, and is therefore disadvantageously inefficient. Third, the use of fixed-length sequences disadvantageously constrains the adaptive frequency selection process.

The invention has been described mainly in the context of channel bandwidth varying due to the impact of noise or interference, but it has many other applications, including the following.

In different environments or applications, different channel bandwidths may be available for transmission, for example due to different regulatory spectrum restrictions in different regions. In a preferred embodiment, the invention may provided a fixed hardware implementation, using predetermined frame and symbol lengths and predetermined error detection, which can advantageously accommodate such different bandwidth allocations. Preferably, only software modifications may be required to allow the hardware to operate in such different applications. The cost advantages of a fixed hardware implemention may then be achieved by the invention even if the bandwidth allocations are not affected by variable channel conditions. The adaptive channel portion selection step of the invention may then only be performed once, when the hardware implementation is set up and the channel portion(s) for transmission allocated, and not necessarily in real time during operation of a transmitter and receiver to follow varying channel conditions.

In a further embodiment, the invention may advantageously enable efficient adaptive sharing of bandwidth between two of more users. If a controller adaptively allocates bandwidth in a channel between two or more transmitters embodying the invention, and informs the transmitters and corresponding receivers of the adaptive allocation of channel portions to each within the channel, the transmitters may advantageously adapt the number of data bits in each frame they transmit in order to map their transmitted frames onto their allocated channel portion or portions.

The applications of the invention described herein are exemplary applications and do not form an exhaustive list. Further applications and embodiments of the invention will be readily apparent to the skilled person in the light of the present disclosure.

DESCRIPTION OF SPECIFIC EMBODIMENTS AND BEST MODE OF THE INVENTION

Specific embodiments of the invention will now be described by way of example with reference to the drawings, in which.

Figure 1:
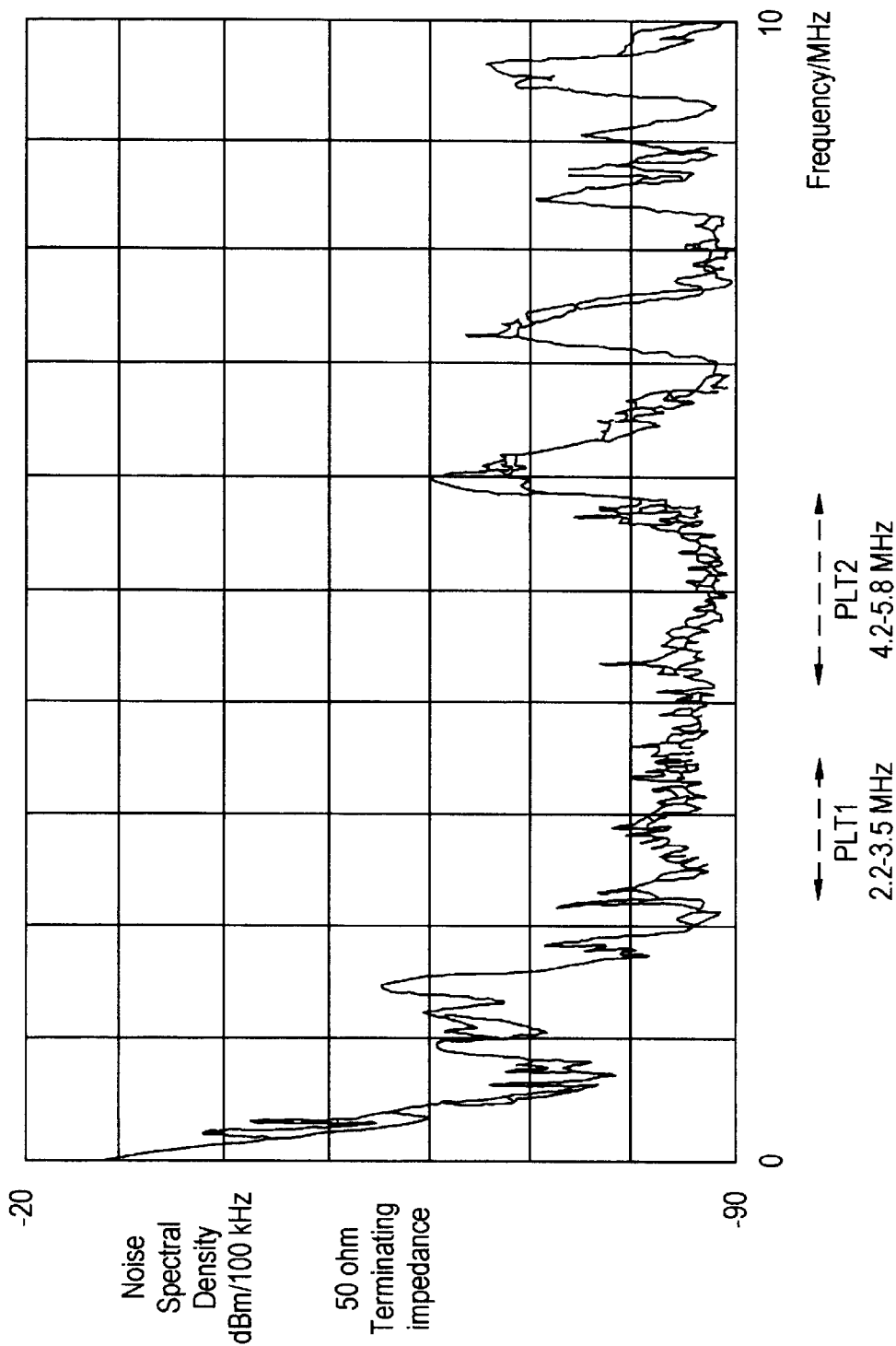
FIG. 1 shows typical background noise on a powerline (PL) link to a domestic subscriber, and two potential frequency bands for data transmission PLT1 and PLT2.
Figure 2:
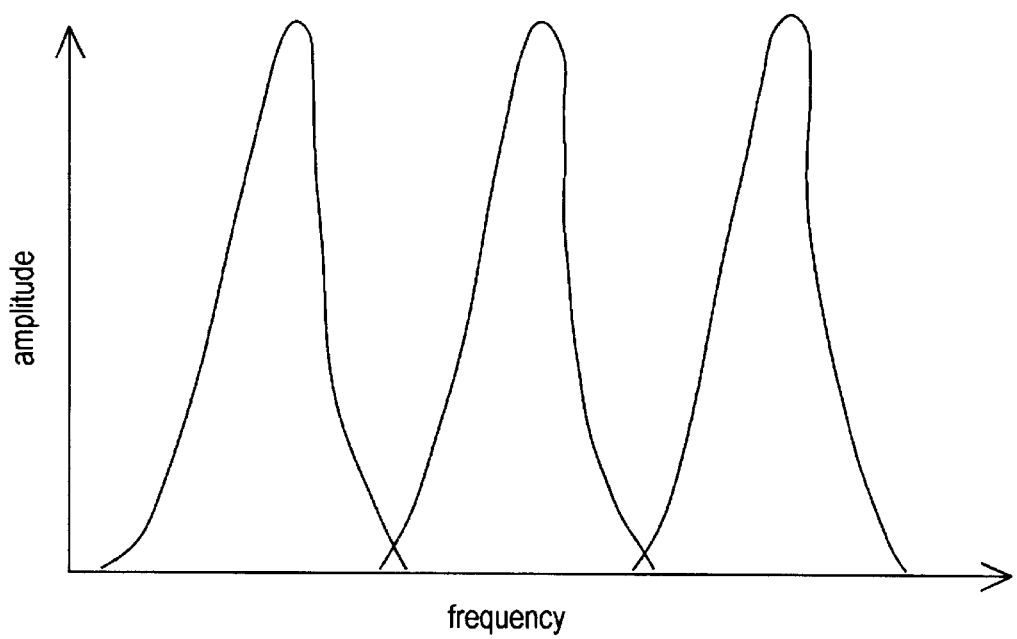
FIG. 2 illustrates a plurality of OFDM sub-carriers.
Figure 3:
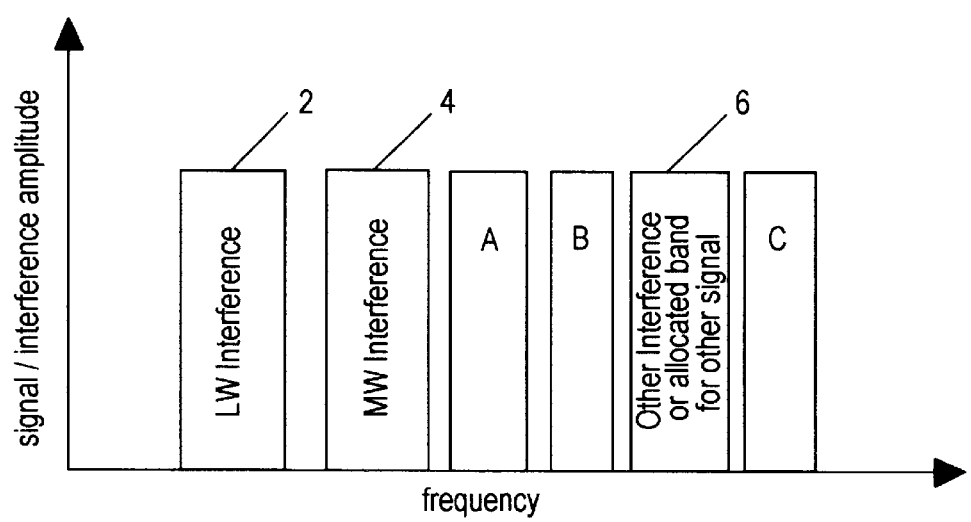
FIG. 3 shows three allocated data transmission frequency bands in a PL system.

In the frequency domain, in the following example, three non-contiguous sub-channels (channel portions) A,B,C are allocated for data transmission. As illustrated in FIG. 3 these may be, for example, three frequency bands in a PL system in which interference from radio signals, such as long wave and medium wave transmissions, prevents the use of other frequencies 2, 4, 6.

In relation to the following embodiment of the invention, the sub-channels may be considered as channel portions within a contiguous transmission channel D, separated by unused channel portions X,Y.

Figure 4:
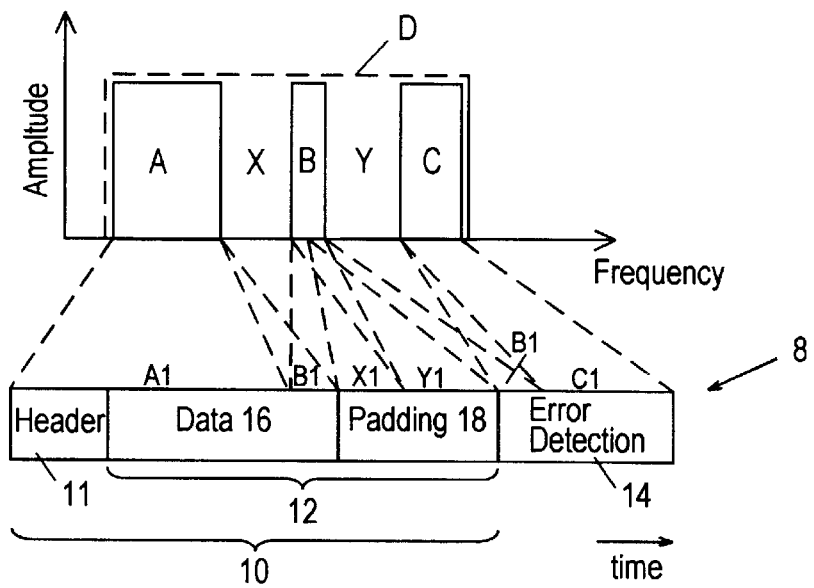
FIG. 4 shows schematically the mapping of a data frame between the time domain and three channel portions in the frequency domain according to a first embodiment of the invention.

According to a first embodiment of the invention, a data frame is assembled in the time domain and is then mapped to the frequency domain for transmission as illustrated schematically in FIG. 4. Each data frame 8 assembled by the transmitter is of fixed length, typically 255 bytes, and comprises a payload 10, including a header 11 (containing appropriate timing (synchronisation) and addressing information) and a data portion 12, and an error detection coding portion 14.

Each frame contains a fixed-length payload and a fixed-length error detection portion; within the payload, the lengths of the header and the data portion are also fixed, and the ratio of error detection bytes to payload bytes is predetermined according to the level of error detection required, which will vary depending on the medium in use.

The frame length in the time domain and the corresponding symbol duration in the frequency domain are interrelated such that each frame maps into the transmission channel D so as to fill one symbol.

On assembling a frame, the data portion 12 is partially filled with data bytes 16. The number of data bytes is determined such that, on mapping the frame into a symbol in the frequency domain for transmission, the header, data bytes and error detection bytes in the frame map into, and fill, the allocated transmission channel portions A,B,C. The remainder of the data portion 12 is filled with a sequence of padding bytes 18, such as a series of zero bytes, or nulls. On mapping the frame into a symbol in the frequency domain for transmission, the padding bytes therefore map into, and fill, the unused channel portions X,Y.

Once the payload of the frame has been filled, block coding, such as Reed Solomon coding, is applied to it to generate error detection and correction bytes, which fill the error detection portion 14 of the frame. Any required conventional time domain processing, such as interleaving or randomising, is then performed before the frame is mapped into the frequency domain for transmission as illustrated in FIG. 4 (which omits the interleaving and randomising steps for clarity).

As anticipated above, the frame is mapped into a symbol in the transmission channel D such that the error detection portion 14 and all bytes in the payload other than the padding bytes (i.e. the header 11 and the data bytes 16) map into the allocated, or adaptively-selected, channel portions A,B,C, and the padding bytes 18 map into the unused channel portions X,Y. Thus, in FIG. 4, frame portions A1, B1, C1, X1 and Y1 map into channel portions A,B,C, X and Y respectively.

After any time domain processing such as interleaving or randomising, the frame portions A1 to Y1 will not be contiguous when the frame is mapped into the frequency domain. However, all time domain processing must be predictable such that a receiver receiving the frame can reverse it to reassemble the frame. Therefore, during the mapping process, the transmitter can assess each byte of the frame and map each byte appropriately into a channel portion which will be used for transmission or an unused channel portion.

Figure 5:
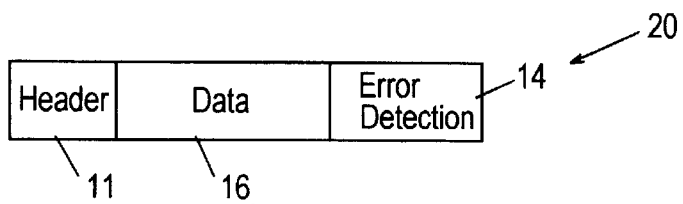
FIG. 5 shows a reduced-length frame according to an embodiment of the invention.

Since the padding bytes map into unused channel portions they are not transmitted. A reduced-length frame 20 as illustrated in FIG. 5 is therefore effectively transmitted, containing only the header 11, data bytes 16 and error detection portion 14.

At the receiver, the mapping is reversed and the padding bytes reinserted to regain the frame in the time domain for decoding. Through the adaptive or preemptive selection process which set up the transmitter and receiver to use the allocated sub-channels, both the transmitter and receiver can evaluate how many padding bytes are required. In addition, each is preset to use the same padding sequence. Thus, the receiver can replace the padding 18 into the reduced-length frame to regenerate the full-length, 255 byte frame originally generated at the transmitter. The receiver can then use the block code error detection bytes to remove errors, where possible, from the header and data portions of the frame. Advantageously, however, the receiver can be certain that the contents of the padded portion 18 of the frame are error free. This enables the error correction power of the block coding in relation to the header 11 and the data 16 in the frame to be increased.

In practice, the transmission characteristics of each sub-channel may vary with time due to frequency selective fading. According to a further embodiment of the invention, a fade can be detected at the receiver, for example by sounding the channel or by monitoring an increase in data error rate in a particular sub-channel. The description above has discussed a transmitter and a receiver but in an application such as Internet access between a base station and a subscriber, two-way duplex communication is possible. The receiver can then inform the transmitter if, for example a channel portion fades significantly so that through a real time adaptive frequency selection process the transmitter can stop using the faded channel portion and transmit only in non-faded channel portions. This reduces overall bandwidth but prevents the loss of data which would arise from transmitting in the faded channel portion.

Importantly in such an adaptive or preemptive system, the transmitter and receiver exchange information so that both always know which parts of the spectrum (channel portions, or sub-channels) are currently used and unused.

Figure 6:
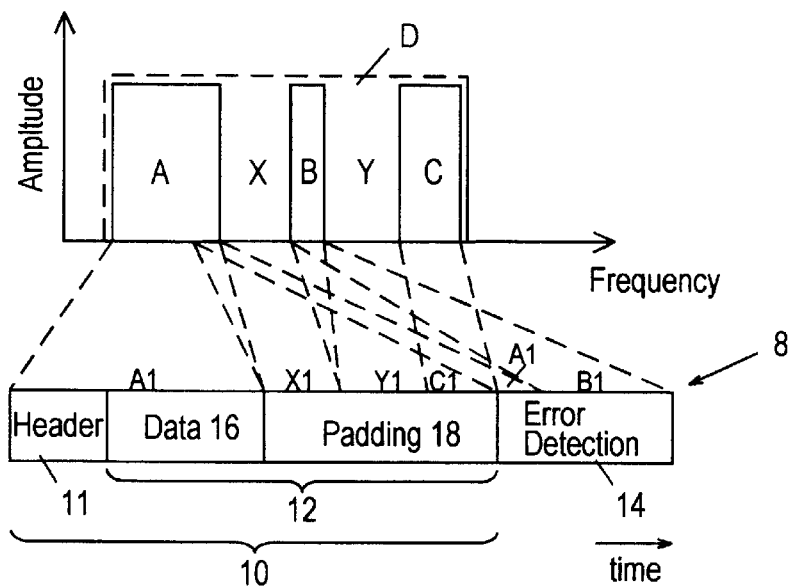
FIG. 6 shows the mapping of a data frame between the time domain and two channel portions in the frequency domain according to a further embodiment of the invention.

When the channel bandwidth is adaptively reduced due to the fading of a channel portion, frames of the same size are assembled, but the number of data bytes in the data portion is reduced and the number of padding bytes increased to fill the data portion 12. Block coding is then applied as described above to the header and the padded data portion and the same number of error detection bytes generated as when the full channel bandwidth is available. Any required further time-domain processing, such as interleaving and randomising, is then performed, before the frame is mapped into the frequency domain as illustrated in FIG. 6. This process is similar to that illustrated in FIG. 4 except that, due to channel fading, one sub-channel or channel portion C which was previously being used is not being used. The header, data bytes and error detection portion of the frame therefore map into the two channel portions A, B. being used and the padding bytes map into the three unused channel portions X,Y,C. It can be seen that the number data bytes in the frame needs to have been decreased, and the number of padding bytes increased, in response to the adaptive channel portion selection process to accommodate the more limited bandwidth now available for transmission.

In this way the symbol length, in terms of time, and the symbol transmission frequency, are advantageously maintained despite the reduced channel bandwidth.

At the receiver, the reduced length frame is received, repadded, error corrected and the data extracted as described in the first embodiment above, taking account of the increased padding required due to the non-use of one previously used channel portion C. However, it should be noted that the number of error detection bytes in the frame has been maintained despite the reduction in transmission bandwidth, and that a reduced number of header and data bytes has been transmitted. Because the padding bits inserted at the receiver cannot contain errors, the coding power of the error correction of the header and data bytes has therefore increased.

It can therefore be seen that the embodiment not only improves flexibility in the adaptive frequency allocation process but also builds in an adaptive coding power to the system which tracks the channel conditions, increasing the error correction ability of the block coding as the channel conditions deteriorate. In addition, it can be seen that the embodiment allows full use of all available bandwidth as channel conditions change.

In preferred embodiments, the type of block coding used for FEC can be selected according to the transmission protocol and medium being used. For example in a PL environment, Reed Solomon coding has been found to be effective and responds favorably in the context of the embodiment, increasing error correction power as zero padding of the frame increases.

The embodiment finds particular application in slowly-fading channels, where a fade lasts long enough for the fade to be detected and for channel conditions to remain sufficiently stable during transmission of one or more symbols. The embodiment may not respond to fades of shorter duration than one symbol.

The embodiments described above relate to a system in which a contiguous channel D contains several non-contiguous channel portions. Embodiments of the invention may apply however to systems in which only one channel is initially used, the whole of a frame (with no padding) being mapped into that channel during good channel conditions. Frequency selective channel fading affecting only part or parts of the channel bandwidth could then be detected by channel sounding or monitoring and those one or more channel portions taken out of use by means of an adaptive selection process and the padding of subsequent frames. This process is illustrated in FIGS. 7 and 8.

Figure 7:
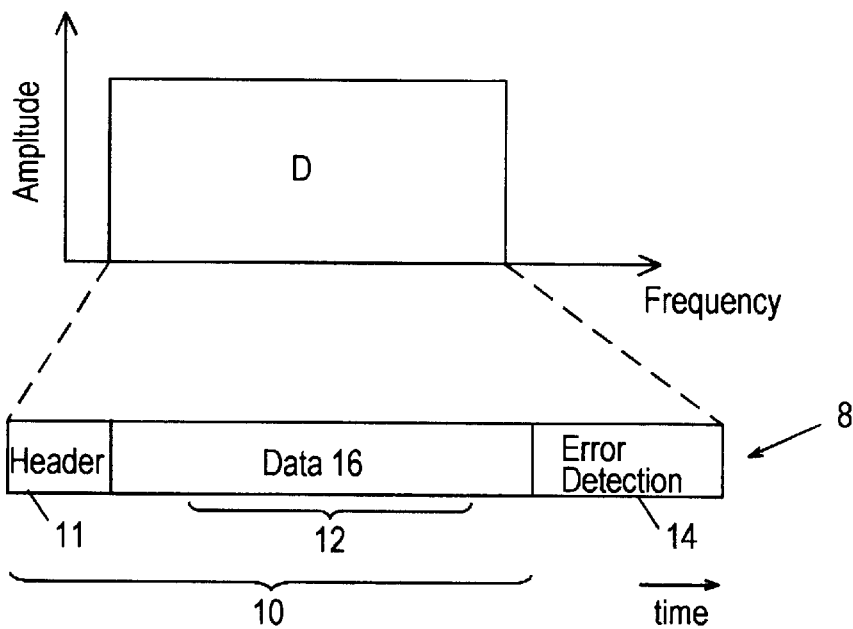
FIG. 7 shows the mapping of a data frame containing no padding bytes into a contiguous channel in the frequency domain.
Figure 8:
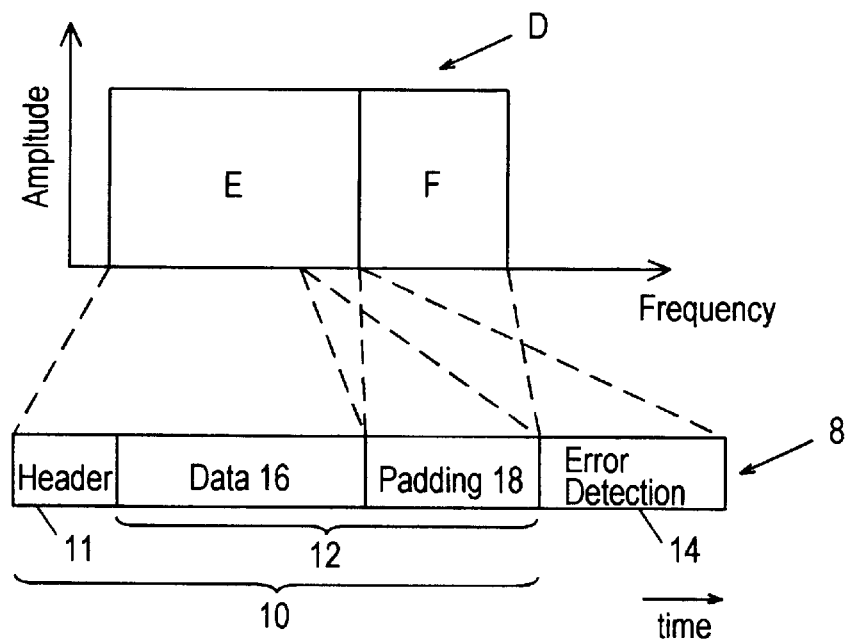
FIG. 8 shows the mapping of portions of a padded data frame for transmission into portions of the channel of FIG. 7 according to a further embodiment of the invention.

FIG. 7 shows a complete frame mapping into a contiguous channel D and FIG. 8 shows a padded frame mapping header, data and error detection bytes into a low frequency channel portion E after frequency selective fading of a high frequency channel portion F. Reference numerals in FIGS. 7 and 8 correspond to those used in FIGS. 4 to 6.

In the embodiments, the unused bytes of the data portion 28 are zero padded 26. However, any padding arrangement can be used, as long as the same padding is used by the transmitter and the receiver.

Although the embodiment described above relates to transmission between a transmitter and a receiver, the same technique may advantageously be used in both directions on a two-way communications link.

Transmission and Reception Apparatus

Figure 9:
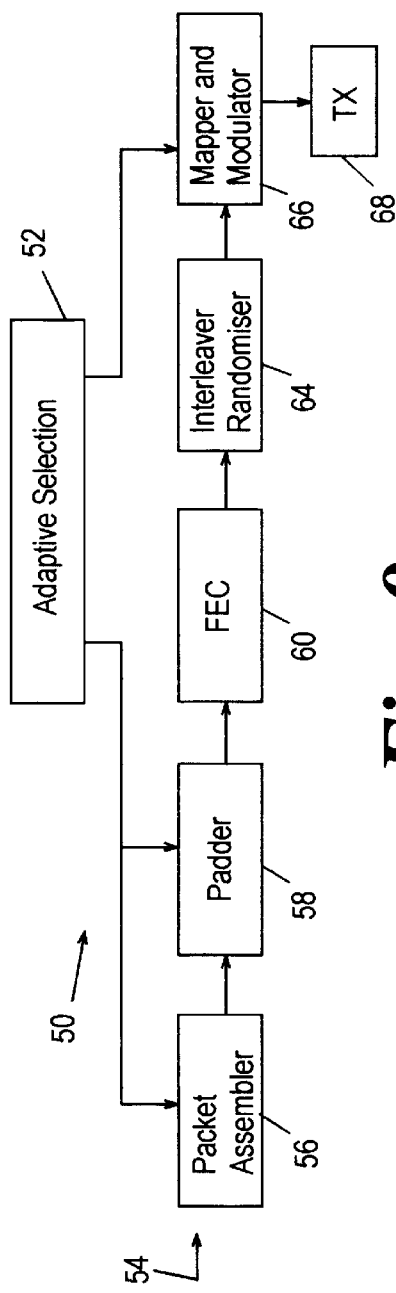
FIG. 9 is a block diagram of a transmission system embodying the invention.
Figure 10:
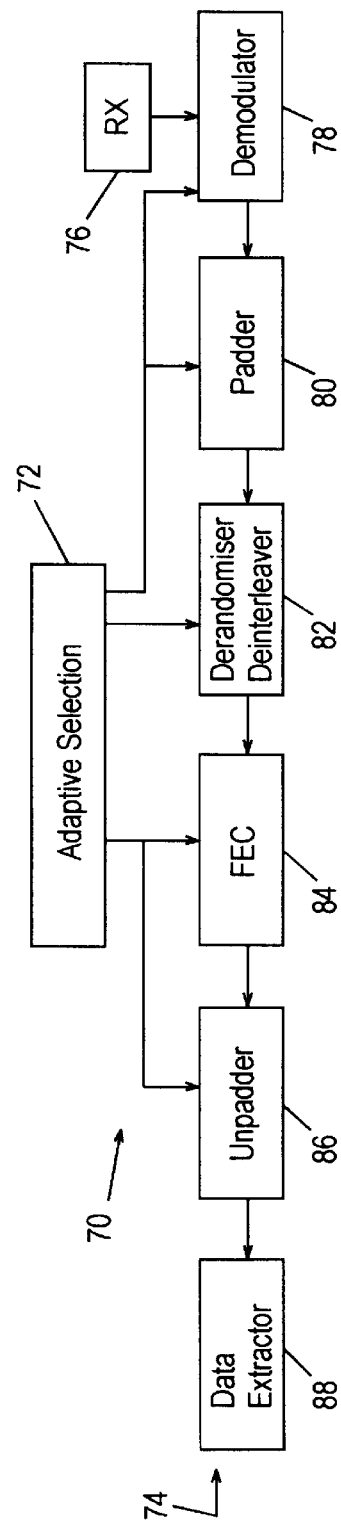
FIG. 10 is a block diagram of a receiver system embodying the invention.

FIGS. 9 and 10 illustrate respectively a transmitter and a receiver embodying the invention for carrying out the transmission and reception methods described above.

The transmitter 50 in FIG. 9 comprises an adaptive sub-channel or channel portion selector 52 and a data frame processing chain 54 at the transmitter and corresponding frame processing for data extraction at the receiver. The adaptive sub-channel selector operates in combination with a similar selector 72 at the receiver to control channel portion allocation and/or to sound the transmission channel at predetermined time intervals, or to monitor data transmission on the transmission channel, and to select adaptively which sub-channels are to be used for future transmissions. This information is exchanged between the transmitter and the receiver to allow control of data frame assembly by the data frame processing chain 54.

The data frame processing chain starts at a frame assembler 56 which assembles the header portion 11 of the frame and inserts an appropriate number of data bytes 16 into the data portion 12, according to the available channel bandwidth evaluated on the basis of bandwidth information received from the adaptive selector. The remaining portion of the data portion 12 of the frame is then zero padded 18 by a padder 58 and FEC block coding performed by a FEC processor 60 to fill the error detection portion 14 of the frame. The frame is then processed by an interleaving and randomising processor 64, and modulated by a mapper and modulator 66 for transmission 68 in the selected sub-channels. The mapper and modulator receives information from the adaptive selector 52 as to which channel portions are in use at any time. The interleaving, randomising and modulation processes depend on the transmission protocols being used in the system, but can be according to any known frequency domain transmission protocol.

The receiver 70 as shown in FIG. 10, comprises an adaptive selector 72, as described above and a frame receiver chain 74. The receiver chain receives transmitted, reduced-length frames at a receiver unit 76 for demodulation by a demodulator 78. The demodulator receives information from the adaptive selector 72 as to the channel portions in use. The reduced-length frame is then padded by a padder 80, using information from the adaptive selector 72 to regenerate the full-length frame created at the transmitter, subject to any errors introduced during transmission. The randomising and interleaving processes are then reversed by a processor 82. Error correction is then performed by a FEC receiver processor 84, taking account of the fact that errors can only have arisen in the portions of the frame which have been transmitted and not in the padded portion 18. After error correction, the frame is depadded by a depadder 86 and the data extracted by a data extractor 88. Alternatively, depadding may be omitted and the data extracted directly from the padded frame, ignoring the padded portion.

What is claimed is:

1. A method of operating a frequency domain data transmission system to transmit a data frame from a transmitter to a receiver using a transmission frequency band from which one or more frequency band portions are selected, by adaptive or pre-emptive selection or by allocation, for data transmission such that the frequency band contains one or more unused frequency band portions, comprising the steps of;

inserting data bits into a payload portion of the data frame;

padding with a predetermined bit sequence a portion of the payload;

applying error correction to the data bits and the padding bits and inserting error detection bits into the frame to form a data frame of a predetermined length;

mapping the data frame-into the transmission frequency band such that the payload and the error detection bits are mapped to and transmitted in the one or more selected frequency band portions and the padding bits are mapped to the one or more unused frequency band portions and are not transmitted;

receiving the data bits and the error detection bits from the one or more selected frequency band portions;

reinserting the padding bit sequence to restore the predetermined length frame, subject to any transmission errors;

applying error correction using the error detection bits to correct the transmission errors in the data bits, where possible; and extracting the data bits.

2. A method according to claim 1, in which the predetermined bit sequence is a sequence of zero bits.

3. A method according to claim 1, in which the error correction is performed by a block coding technique.

4. A method according to claim 1, in which the error correction is performed by Reed Solomon coding.

5. A method according to claim 1, in which the error correction has an error correction capability which increases as the length of the predetermined padding bit sequence increases.

6. A method according to claim 1, in which the selection of frequency band portions for data transmission is independent of the predetermined length of the padded data frame.

7. A method according to claim 1, in which the predetermined length of the padded data frame is equal to the length of a data frame transmittable if the entire transmission frequency band were selected for transmission.

8. A method according to claim 1, in which the error correction has an error correction capability which is maintained independent of the bandwidth of the selected frequency band portions by adaptively varying the ratio of the number of data bits to the number of error detection bits in a data frame in accordance with the bandwidth of the selected frequency band portions.

9. A method according to claim 1, further comprising the step of sounding or monitoring the frequency band, or the selected frequency band portions, and modifying the selection of frequency band-portions in response to channel fading-in order to prevent use of frequency band portions likely to give rise to high transmission error rates.

10. A data transmission and reception system for implementing a method for operating a frequency domain transmission system as defined in claim 1.

11. A reduced-length data frame as transmitted using the method defined in claim 1.

12. A method of transmitting data in the frequency domain on a transmission frequency band from which one or more frequency band portions are selected, by adaptive or pre-emptive selection or by allocation, for data transmission, comprising the steps of;

inserting data bits into part of a payload portion of a data frame, leaving an unfilled part of the payload portion;

inserting padding bits into the unfilled part of the payload portion;

performing an error correction procession the payload portion to generate error detection bits, and inserting the error detection bits into an error detection portion of the data frame; and mapping the frame into the frequency domain for transmission such that the error detection portion and all contents of the payload portion other than the padding bits map into the selected channel portions.

13. A transmitter for transmitting data using the method defined in claim 12.

14. A method of receiving data in the frequency domain on a transmission frequency band from which one or more frequency band portions are selected, by adaptive or preemptive selection or by allocation, for data transmission, in which data frames of a predetermined length, comprising a header and data bytes in a payload portion and error detection bytes in an error detection portion, are transmittable if all of the frequency band were used for data transmission, comprising the steps of;

receiving from the transmission frequency band a data frame of a reduced length, less than the predetermined length, and mapping it from the frequency domain to the time domain;

padding the payload portion of the frame with a predetermined padding bit sequence to restore the reduced-length frame to the predetermined length;

performing error correction using the error detection bits to detect and correct any transmission errors in the data bits, where possible; and extracting the corrected data bits from the data frame.

15. A receiver for receiving data using the method defined in claim 14.

* * * * *